United States Patent [19]
Bahl et al.

[11] Patent Number: 4,701,573
[45] Date of Patent: Oct. 20, 1987

[54] SEMICONDUCTOR CHIP HOUSING

[75] Inventors: Inder J. Bahl; Edward L. Griffin, both of Roanoke, Va.

[73] Assignee: ITT Gallium Arsenide Technology Center, Roanoke, Va.

[21] Appl. No.: 780,494

[22] Filed: Sep. 26, 1985

[51] Int. Cl.$^4$ ............................................. H01L 23/02
[52] U.S. Cl. .................................. 174/52 FP; 357/68
[58] Field of Search ......................... 174/52 FP, 52 H; 357/68

[56]  References Cited

U.S. PATENT DOCUMENTS

| 3,622,419 | 11/1971 | London et al. | 174/52 FP X |
| 3,671,813 | 6/1972 | Wilcox | 174/52 FP X |
| 3,683,241 | 8/1972 | Duncan | 174/52 H X |
| 3,715,635 | 2/1973 | Michel et al. | 357/68 |
| 3,946,428 | 3/1976 | Anazawa et al. | 357/74 |
| 4,400,870 | 8/1983 | Islam | 29/588 |

FOREIGN PATENT DOCUMENTS

| WO84/01666 | 4/1984 | PCT Int'l Appl. |
| 1130666 | 10/1968 | United Kingdom . |
| 1334998 | 10/1973 | United Kingdom . |
| 1352364 | 5/1974 | United Kingdom . |
| 1426543 | 3/1976 | United Kingdom . |
| 1484177 | 9/1977 | United Kingdom . |
| 1499889 | 2/1978 | United Kingdom . |
| 2065970 | 7/1981 | United Kingdom . |
| 2103420 | 2/1983 | United Kingdom . |

Primary Examiner—Arthur T. Grimley
Assistant Examiner—D. A. Tone
Attorney, Agent, or Firm—Robert A. Walsh; Mary C. Werner

[57]  ABSTRACT

A semiconductor chip housing provides hermetic sealing and appropriate electrical characteristics for use at high frequencies. The housing comprises a substrate in which the chip is mounted and a cylindrical tube having a top cover and extending above the substrate which impinges on a base and thus hermetically seals the chip. Microthin leads extend from the substrate periphery to the chip. The leads carrying high frequency signals have notches therein to compensate for the impedance introduced by the tube and to enable the microstrip to present a constant impedance at high frequencies throughout its length.

7 Claims, 1 Drawing Figure

SEMICONDUCTOR CHIP HOUSING

BACKGROUND OF THE INVENTION

1. Field of the Invention

The present invention relates to a housing for the packaging of semiconductor chips. It is particularly suitable for the packaging of the MESFETs (metal semiconductor field effect transistors) and MMICs (microwave monolithic integrated circuits) which are made of gallium arsenide and are used at frequencies up to 20 GHz.

2. Description of the Prior Art

Commercially available packages have been developed for housing MESFETs and MMICs for various frequency ranges, but none of these have the capability for providing a good response for these circuits over the entire 1–20 GHz frequency range. Among the problems encountered with these packages are their limited frequency range, excessive transmission losses, and limited input and output isolation.

SUMMARY OF THE INVENTION

It is an object of the present invention to provide a semiconductor chip housing which is capable of the necessary frequency response when gallium arsenide chips are contained therein and utilized at frequencies at least up to 20 GHz.

It is a further object of the present invention to provide a semiconductor chip housing which meets the environmental requirements of MIL-S-19500 and the test requirements of MIL-STD-750/883. Thus the housing must pass rigorous tests with regard to hermeticity, thermal and mechanical shock, moisture resistance and resistance to a saline atmosphere, vibration and acceleration, and solderability.

It is still another object of the present to provide semiconductor chip housing with an efficient thermal dissipation path for high power applications.

It is yet another object of the present invention to provide a semiconductor chip housing having the electrical characteristics of low parasitic impedances, minimum discontinuity reactances, minimum dissipation losses and minimum interaction between the surroundings and the input and output.

It is a further object of the present invention to provide a semiconductor chip housing in which the voltage standing wave ratio (VSWR) of the housing is minimized. In this regard, it is a specific design objective to develop a housing wherein the voltage standing wavelength ratio does not exceed 1.15:1 for frequencies up to the Ku band (18 Ghz).

The above objects are attained by providing a housing for semiconductor chips comprising a substrate having one or more holes therein in which chips can be mounted. The substrate has a plurality of conductor strips each extending from the periphery of the substrate to one of the chip holes and at least some of the conductive strips have a notch therein to compensate for inductive and capacitive reactances of the strip itself as well as the impedance of a hermetically sealing container whose walls extend above and below the substrate, and whose bottom impinges on a base which functions as a heat sink. Such a housing provides the advantages of being easy to handle, being easy to mount on the external subcircuit and subsystems, being rugged, having less risk of electrical (static) and mechanical damage to the chip, capable of being stored safely in metal containers and providing excellent measurability.

BRIEF DESCRIPTION OF THE DRAWING

The drawing FIGURE shows an exploded view of the components of the semiconductor chip housing in perspective.

DETAILED DESCRIPTION OF THE INVENTION

Figure 1:
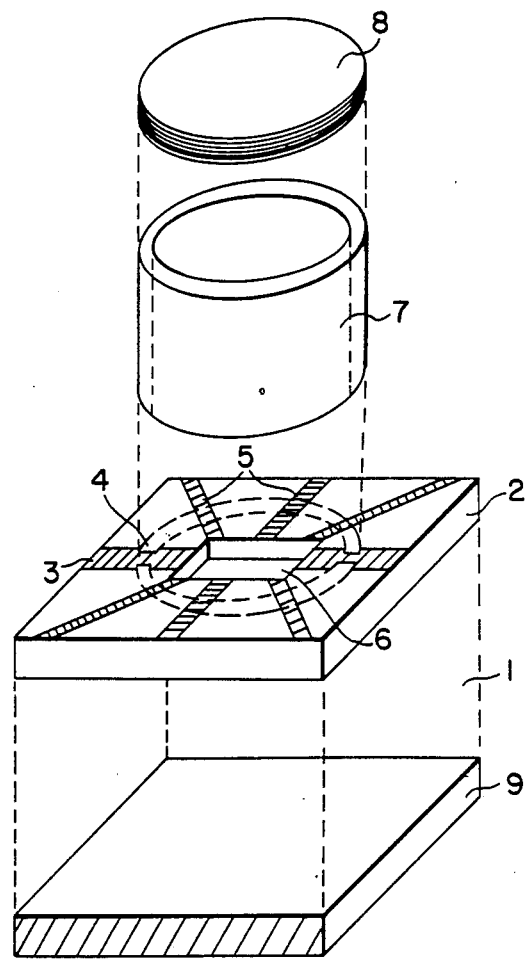

The drawing FIGURE show a semiconductor chip housing 1 comprising a substrate 2 on which rest input and output leads 3. The input and output leads each extend from the periphery of the substrate to an opening 6 in which a semiconductor chip can be mounted. The leads 3 are sized in width such as to present a constant impedance of 50 ohms from the chip position all the way to the substrate periphery for microwave frequencies as high as 25–30 GHz. To facilitate achieving this constant 50 ohm impedance it has been found desirable to provide a notch 4 in each of the input and output leads. The dimensions of the notch portion 4 of the strips 3 are made such that the discontinuity capacity due to the loading of the microstrip 3 with the dielectric tube 7 is compensated for. The dielectric tube 7 may be made of ceramic material and, together with a ceramic or metal cover 8 and the base 9, forms a hermetically sealed enclosure for the semiconductor chip. The base 9, on which the substrate 2 is attached, may be made of copper and tungsten, has good thermal conductivity, and serves as a heat sink for the housing.

It should be noted that the notches 4 in the microstrip 3 also function to compensate for the predominantly capacitive impedance present in the line of high frequencies. Thus they function to maintain the constant impedance throughout the length of the microstrip and thereby minimize reflection coefficients so as to achieve a low voltage standing wave ratio.

The microstrips 5 do not have notches since they are used with DC inputs and outputs. The number of microstrip leads on the substrate 2 would of course depend on the chip or chips being enclosed. Likewise, optimum dimensions for the various components of the semiconductor chip housing would depend on the type of chips being used as well as the frequencies of operation.

The manufacturing process for the housing comprises stacking "green" ceramic sheets to the required height of the substrate, cutting chip holes therein, overlaying the top of the substrate with tungsten paste to form the desired lead configuration, using a plurality of green ceramic rings to form a cylinder overlying the substrate and intersecting the leads at the notch areas, and then firing the whole ceramic configuration to transform it into one continuous piece which is attached to the metal base to form a hermetically sealed enclosure for a chip.

While we have described above the principles of our invention in connection with specific apparatus, it is to be clearly understood that this description is made only by way of example and not as a limitation to the scope of our invention as set forth in the objects thereof and in the accompanying claims.

We claim:

1. A housing for semiconductor chips to be operated at high frequency, said housing comprising:
    a substrate having at least one hole therein in which a semiconductor chip can be mounted;

container means connected to and extending above said substrate for hermetically sealing said semiconductor chip; and a plurality of conductive strips extending from peripheral portions of said substrate to said at least one hole, selected ones of said plurality of conductive strips having notched areas therein, said notched areas of said conductive strips exhibiting a reduced width compared to remaining portions of said selected ones of said conductive strips, said notched areas of said selected ones of said conductive strips being dimensioned to compensate for capacitive impedance present at said high frequency and loading by said container means.

2. The housing of claim 1 wherein said conductive strips have such widths so as to produce a substantially constant impedance to signals of microwave frequency throughout their length.

3. The housing of claim 2 wherein said impedance is 50 ohms and said frequencies are 1–30 GHz.

4. The housing of claim 1 wherein said container has a wall or walls which intersect said strips in the notched areas.

5. The housing of claim 4 further comprising a base having greater area than said container and to which the substrate is attached.

6. The housing of claim 5 wherein said base is metallic and functions as a heat sink.

7. The housing of claim 5 where said container is a ceramic tube which functions as a dielectric.

* * * * *